US008665038B2

(12) United States Patent
Belot et al.

(10) Patent No.: US 8,665,038 B2
(45) Date of Patent: Mar. 4, 2014

(54) BULK ACOUSTIC WAVE RESONATOR FILTER BEING DIGITALLY RECONFIGURABLE, WITH PROCESS

(75) Inventors: Didier Belot, Rives (FR); Alexandre Augusto Shirakawa, Talence (FR); Eric Kerherve, Talence (FR); Moustapha El Hassan, Talence (FR); Yann Deval, Bordeaux (FR)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 665 days.

(21) Appl. No.: 12/371,415

(22) Filed: Feb. 13, 2009

(65) Prior Publication Data

US 2009/0251235 A1  Oct. 8, 2009

(30) Foreign Application Priority Data

Feb. 15, 2008 (FR) ...................................... 08 00827

(51) Int. Cl.
*H03H 9/54* (2006.01)
*H04B 1/10* (2006.01)
*H04B 1/40* (2006.01)

(52) U.S. Cl.
USPC .......... 333/188; 333/189; 333/17.1; 375/344; 455/75; 455/77; 455/78; 455/266; 455/307

(58) Field of Classification Search
USPC ......... 333/188, 189, 191–196, 17.1; 370/201, 370/278, 282, 342; 375/344, 346; 455/75, 455/77, 78, 80, 154.1, 192.3, 266, 296, 307
See application file for complete search history.

(56) References Cited

U.S. PATENT DOCUMENTS

| 5,793,261 | A  | * | 8/1998  | Boling, III ............... 332/102 |
| 6,018,281 | A  | * | 1/2000  | Taguchi et al. ............ 333/193 |
| 6,472,953 | B1 | * | 10/2002 | Sakuragawa et al. ...... 333/133 |
| 6,525,624 | B1 | * | 2/2003  | Hikita et al. ............... 333/133 |
| 6,681,102 | B1 | * | 1/2004  | Collier et al. .............. 455/296 |
| 6,870,445 | B2 | * | 3/2005  | Kawakubo et al. ........ 333/187 |

(Continued)

FOREIGN PATENT DOCUMENTS

JP          2000-101380       *    4/2000

OTHER PUBLICATIONS

Razafimandimby et al.; "Digital Tuning of an Analog Tunable Bandpass BAW-Filter at GHz Frequency"; 33rd European Conference on Solid State Circuits, ESSCIRC 2007, pp. 218-221, Munich, Sep. 11-13, 2007.*
El Hassan, M. et al., "Reconfiguration of Bulk Acoustic Wave Filters: Application to WLAN 802.11b/g (2.40-2.48 GHz)," in 13th IEEE International Conference on Electronics, Circuits and Systems, Nice, France, Dec. 10-13, 2006, pp. 395-398.

(Continued)

*Primary Examiner* — Barbara Summons
(74) *Attorney, Agent, or Firm* — Seed IP Law Group PLLC (57) ABSTRACT

A filtering circuit with BAW type acoustic resonators having at least a first quadripole and a second quadripole connected in cascade, each quadripole having a branch series with a first acoustic resonator of type BAW and a branch parallel with each branch having an acoustic resonator of type BAW, the first acoustic resonator having a frequency of resonance series approximately equal to the frequency of parallel resonance of the second acoustic resonator, the branch parallel of the first quadripole having a first capacitance connected in series with the second resonator and, in parallel with the capacitance, a first switching transistor to short circuit the capacitance.

17 Claims, 8 Drawing Sheets

(56) References Cited

U.S. PATENT DOCUMENTS

| | | | |
|---|---|---|---|
| 7,030,718 B1 * | 4/2006 | Scherer | 333/188 |
| 7,259,643 B2 * | 8/2007 | Son et al. | 333/174 |
| 8,351,885 B2 * | 1/2013 | Dubash et al. | 455/180.3 |
| 2005/0212612 A1 | 9/2005 | Kawakubo et al. | |
| 2009/0039981 A1 * | 2/2009 | Ito et al. | 333/188 |
| 2009/0072925 A1 * | 3/2009 | Cathelin et al. | 333/188 |
| 2009/0325521 A1 * | 12/2009 | Dubash et al. | 455/150.1 |

OTHER PUBLICATIONS

El Hassan, M. et al., "A New Method to Reconfigure BAW-SMR Filters Using CMOS Transistors," in IEEE/MTT-S International Microwave Symposium, Jun. 3-8, 2007, Honolulu, Hawaii, pp. 1603-1606.

* cited by examiner

BULK ACOUSTIC WAVE RESONATOR FILTER BEING DIGITALLY RECONFIGURABLE, WITH PROCESS

BACKGROUND

1. Technical Field

The present disclosure relates to electronic circuits and more particularly to a filtering circuit with Bulk Acoustic Wave (BAW) resonators that can be digitally reconfigured.

2. Description of the Related Art

Today acoustic resonators are widespread in consumer applications but also in professional applications because of their high efficiency, including the realization of high performance band pass filters, and in particular in mobile telephony for the selection of transmission channels.

Research has been conducted on two types of acoustic resonators that show remarkable performance, namely the SAW resonators (Surface Acoustic Wave Resonator) and, more recently, the BAW (Bulk Acoustic Wave Resonator). In the first type, the acoustic resonator is located on the surface of a semiconductor product while in BAWs it lays inside a volume delimited between a lower electrode and a higher electrode so that the acoustic wave develops in this volume. BAW resonators are the subject of wide research from manufacturers of semi-conductor products because those components allow consideration of a high degree of integration of filtering circuits, thus allowing significant manufacturing costs savings.

BAW resonators allow higher frequencies than those used with SAWs, while achieving more compact structures.

Beyond the performance offered by BAW resonators for the realization of a digital filter, there is a need for easy configuration of filtering characteristics of a filter made of BAW resonators.

Such configuring has been achieved, so far, by using varactors connected in series or in parallel with the resonators and which are controlled by the application of an analog voltage.

Such a device, if it has some merit, however, requires a complex control and thus a sophisticated analog circuitry.

It is desirable to simplify the design of the command of the adjustment of acoustic resonators used in filtering circuits to allow, in particular, a more sophisticated command while being less costly to implement.

BRIEF SUMMARY

The present disclosure is directed to a structure of filters—suitable for mobile telephony—made of BAW acoustic resonators that are easily configurable. The present disclosure also provides a low cost filter fitted with acoustic resonators that allows a complete digital control of the frequency response. The present disclosure further provides a filtering circuit with BAW resonators integrated on a substrate of semiconductor material and which can be easily digitally configured.

In accordance with one embodiment, a BAW acoustic resonators filtering circuit is provided that includes at least a first and a second quadripole connected in cascade, each quadripole comprising a series branch with a first BAW type acoustic resonator and a parallel branch with a second BAW type acoustic resonator. The first BAW resonator has a frequency of the series resonance that is approximately equal to the frequency of the parallel resonance of the second acoustic resonator.

The circuit is characterized in that the parallel branch of the first quadripole includes a first capacitance that is connected in series with the second resonator, and which is connected in parallel with that capacitance, a first switching transistor controlled by a first control voltage for performing a short circuit of that capacitance.

In one embodiment, the second quadripole includes a second capacitance connected in series with the second resonator and, in parallel with the latter, a second switching transistor controlled by a second control voltage and designed for performing a short circuit of that capacitance.

Thus the control voltages of the first, the second (and more when appropriate) switching transistors may be conveyed through a control bus that allows a fully digital control of the filtering characteristics of the acoustic resonator filtering circuit.

One can thus, from the outset, perform a full digital control of the filtering circuit by appropriate digital processing. The use of analog components, such as the expensive and not so easy to use varactors, can thus be avoided.

In one particular embodiment, the resonators are all of the Surface Mounted Resonator (SMR) type and are arranged on a mirror of Bragg.

In one particular embodiment, the filtering circuit is used to achieve a reception circuit in mobile telephony of the 4th generation.

The disclosure also achieves a process of reducing the interference suffered by a receiver in a mobile telephone comprising a filtering circuit based on a cascade of cells, each having a parallel branch with a first acoustic resonator type BAW, and a serial branch with a second acoustic resonator type BAW, that second BAW mounted in series with a capacitance having a switching transistor connected to its terminals.

The process includes the following steps:
detecting the presence of a signal disturbance in the close vicinity of one band being used for communications with one mobile telephone and which might disturb that communication; and
digital control, in response to a possible detection, of one or more transistors in order to introduce the effect of capacitances connected in series with the resonators of parallel branches so as to change the poles of the filter and increase its selectivity In accordance with another embodiment of the present disclosure, a circuit is provided that includes a plurality of series-coupled quadripole cells, each cell having first and second inputs and first and second outputs, the first and second outputs coupled to first and second inputs of an adjacent quadripole cell, with the first and second outputs of a last cell in the plurality of cells forming an output of the circuit. Each cell further includes a series branch having a first acoustic resonator coupled between the first input and the first output, a parallel branch coupled between the first input and the first output and having coupled in series a second acoustic resonator and a capacitance with a switching transistor coupled in parallel with the capacitance. The first acoustic resonator has a series resonant frequency that is approximately equal to a parallel resonant frequency of the second acoustic resonator.

In accordance with another aspect of the foregoing embodiment, the acoustic resonators are of the BAW type. Preferably, the BAW resonators are Surface Mounted Resonators arranged on a mirror of Bragg.

In accordance with another aspect of the foregoing embodiment, the first acoustic resonator has a series resonant frequency that is approximately equal to the parallel resonant frequency of the second acoustic resonator in each of the quadripole cells.

In accordance with another aspect of the foregoing embodiment, each of the switching transistors are coupled to a digital control bus used for tuning the circuit.

In accordance with another embodiment of the present disclosure, a circuit is provided that includes a plurality of resonator cells coupled in series, and including at least: a first resonator cell that has two inputs and two outputs, an acoustic resonator coupled in series between the first input and the second output, and a series coupled resonator and capacitance coupled between the first input and the second output, and a switching transistor coupled in series with the capacitance to short-circuit the capacitance; a second resonator cell in the plurality of series-coupled resonator cells having first and second inputs coupled to the respective first and second outputs of the first quadripole cell, first and second outputs, a resonator coupled in series between the first input and the first output, and a second resonator coupled between the first input and the second input; and at least a third resonator cell in the plurality of series-coupled resonator cells having first and second inputs coupled to the first and second outputs of the second resonator cell and a series coupled resonator and capacitance coupled between the first and second inputs, and a switching transistor coupled in parallel with the capacitance to short-circuit the capacitance.

In accordance with another aspect of the foregoing embodiment, the circuit has a series resonant frequency that is $$f_s = \frac{1}{2\pi} \sqrt{\frac{C_0 + C_a + C}{(CC_aL_a + C_0C_aL_a)}}.$$

BRIEF DESCRIPTION OF THE SEVERAL VIEWS OF THE DRAWINGS

The foregoing and other features and advantages of one or more embodiments of the disclosure will best be understood by reference to the following detailed description when read in conjunction with the accompanying drawings, wherein.

DETAILED DESCRIPTION

There will now be described one embodiment of a reconfigurable filtering circuit that is particularly suitable for achieving a receiver that receives a Radio Frequency (RF) signal for use in mobile telecommunications and integrated on circuits of Very Large Scale Integration (VLSI) type. In mobile telephony, and in particular in the latest applications such as Wide Code Division Multiplexing Access (WCDMA), there is a need for effective filtering so as to distinguish separate channels that are particularly close to each other. This is, however, only one non-limitative example of such a use of the embodiment that will be described below.

The filtering circuit includes a set of Bulk Acoustic Wave (BAW) acoustic resonators that are manufactured with conventional techniques, such as thin film deposition by means of sputtering techniques, vacuum evaporation or CVD (Chemical Vapor Deposition) known to those skilled in the art.

Figure 1A:
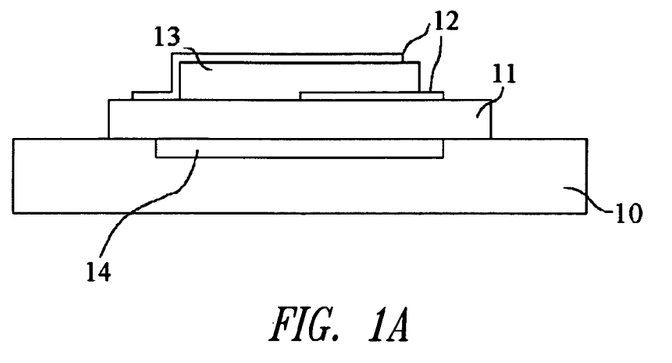
FIGS. 1A and 1B respectively illustrate the structure of a BAW resonator type FBAR or SMR.

FIG. 1A more particularly illustrates the structure of a Film Bulk Acoustic Resonator (FBAR) BAW resonator type that includes a layer of piezoelectric material 13 having acoustic characteristics, electrodes 12 encompassing this layer and an acoustic insulation of the whole structure with respect to a silicon substrate 100 made of silicon (Si), Gallium arsenide (GaAs), glass or ceramic. The piezoelectric material can be ZnO, ALN, ZnS or any ferroelectric ceramics known to those skilled in the art. The electrodes can be made of any metal adapted to the application sought, such as, for example, tungsten (W), aluminum (AL), copper (Cu), molybdenum (MO), nickel (Ni), titanium (Ti), silver (Ag), gold (Au) or tantalum (Ta).

Figure 1B:
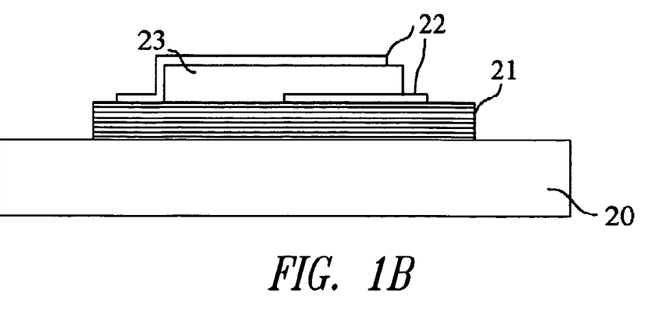

In the structure of FIG. 1B, the acoustic insulation is achieved by means of one membrane 11 arranged over a cavity 14 providing insulation from the substrate 10.

FIG. 1B illustrates more particularly a dual structure of one resonator designated as a Surface Mounted Resonator (SMR). One sees a resonator that includes two electrodes 22 encompassing a layer 23 on top of a reflective element such as a receiver or Bragg mirror 21 by example. This reflective mirror consists of a stack of layers with acoustic properties and different dielectric constants prepared on a substrate 20. In this way, it ensures a minimum loss of acoustic waves within the substrate 20.

The filtering circuit that is described below is based on a SMR type resonator that is particularly suitable for that purpose. Clearly, any other type of FBAR resonator may also be considered by one skilled in this technology.

The circuit described below will include SMR type resonators such as that illustrated in FIG. 1B but it is clear that one skilled in the art may substitute FBAR resonators to SMR resonators and the disclosure is, in no way, limited by the particular acoustic insulation used for forming the BAW resonator.

Generally speaking, the manufacturing process of a BAW-type, a FBAR type or a SMR type resonator is well known and will not be further described. The resonance frequencies typically vary from 0.5 GHz to 5 GHz and those values closely depend upon the nature of material composing the resonator and also from the thickness of the layers being used.

In particular, the two resonance frequencies are characteristics of the nature of the piezoelectric material being used (ZnO, ALN, ZnS or any known ferroelectric ceramics).

Figure 2A:
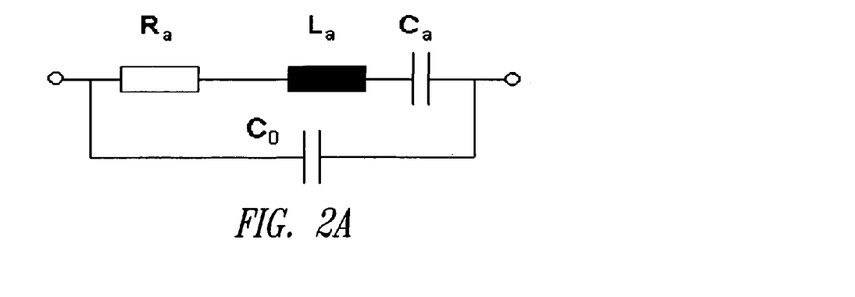
FIGS. 2A and 2B respectively illustrate the BVD model as well as the characteristic impedance curve of the resonator in the vicinity of the resonance frequencies.

FIG. 2A illustrates the electrical diagram equivalent of a resonator BAW, typically referred to as Butterworth Van Dyke (BVD), with parameters Ra, La and Ca being representative of the frequency of the acoustic resonance frequency and also the acoustic losses. More particularly, La represents the equivalent series inductance and Ca represents the equivalent series capacitance of the BAW resonator. The value of the capacitance C0 shown in FIG. 2A corresponds to the physical capacitance between the two electrodes of the resonator.

Figure 2B:
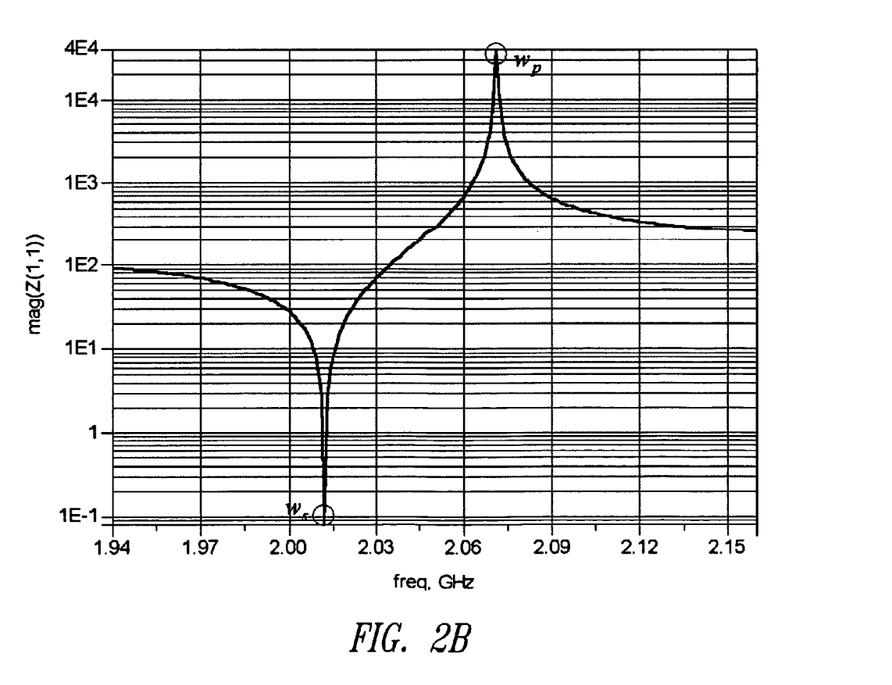

FIG. 2B illustrates the characteristic curve of a resonator, showing two resonances, respectively series (ωs corresponding to a minimum impedance) and parallel (ωp corresponding to a maximum impedance). Outside the vicinity of the two resonances, the resonator tends to behave like a capacitance.

The values ωs and ωp of the series and parallel resonances depend on the thickness of the piezoelectric material, and the gap between these two values results from the electromechanical coupling coefficient.

The BVD equivalent diagram shows an impedance that can be calculated using a simplified formula:

$$Z_{SMR} = \frac{1}{jwC_0} \frac{(w^2 - w_s^2)}{(w^2 - w_p^2)}$$

Figure 3:
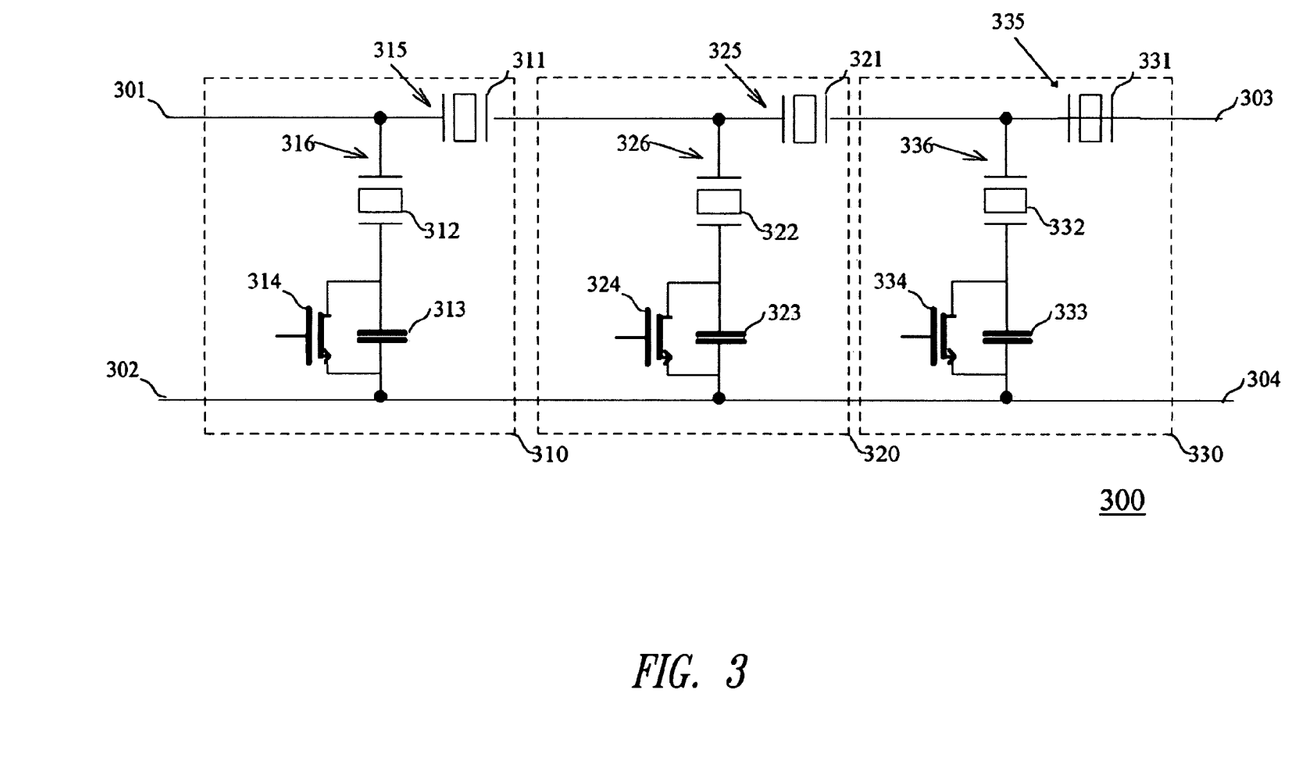
FIG. 3 illustrates the general structure of an embodiment of a filtering circuit digitally configurable according to the present disclosure.

There is now described with respect to FIG. 3 one embodiment of a filter.

The filter consists of a set of cells, 310, 320, 330 respectively, each forming one quadripole.

Cell 310 has two inputs, 301 and 302 respectively, and two outputs (bearing no reference numbers) that are connected at the two inputs of the quadripole forming the next cell 320, etc. In FIG. 3, one sees that the quadripole of the cell 330 has two exits 303 and 304, which are the output electrodes of the filter.

Each quadripole composing the cells 310, 320, 330 comprises a series branch (respectively 315, 325, 335) with a first resonator BAW (respectively 311, 321, 331) and a parallel branch (resp. 316, 326, 336) with a second resonator BAW (resp. 312, 322, 332). BAW resonators (respectively 312, 322, 332) of the parallel branch are sized so as to show a parallel resonance frequency (anti-resonance) that is approximately equal to the serial resonance frequency of the particular resonator BAW (respectively 311, 321, 3312) located in the series branch of the same cell.

In the embodiment shown in FIG. 3, each of the parallel branches 316 and 326 have a capacitance (respectively 313, 323, 333) connected in series with the parallel resonator BAW (respectively 312, 322, 332).

In addition, a MOS transistor (respectively 314, 324 and 334) has two electrodes source and drain that are connected in parallel with the capacitance (respectively 313, 323, 333) and further includes a gate electrode receiving a control voltage for short-circuiting, when appropriate, the corresponding capacitance.

FIG. 3 shows a set of three identical cells that are cascaded, each including one capacitance (resp. 313, 323 and 333) that enables significant control of the characteristics of the individual cell.

It should be observed, however, that it is not essential that all the cells within the cascade of cells include one capacitance, and that one skilled in the art may consider that one or more particular cells will not include one capacitance within the parallel branch.

Therefore, FIG. 3 illustrates one embodiment of a filtering circuit including BAW resonators included in both the series and the parallel branches of each cell, providing a set of terminals receiving the control voltages that form a full digital bus allowing full digital control of the acoustic characteristics of the resonators.

The circuit in FIG. 3 thus provides a particularly simple but effective solution for carrying out a digital control interface for a filter fitted with BAW resonators allowing sophisticated digital processing.

By applying on the set of gate electrodes an appropriate control voltage—either "0" or "1"—one can set the characteristics of operation of the different acoustic resonators and thus, eventually achieve, a fully digital control, directly from a Digital Signal Processor (DSP) of the whole response of the entire acoustic filter without requiring the use of any digital-to-analog converter.

Figure 4A:
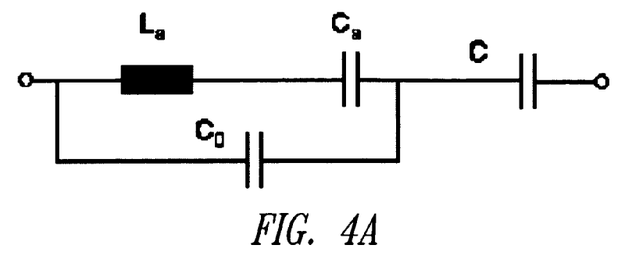
FIGS. 4A and 4B illustrate the electrical model equivalent of the parallel branch of cells 310-330, as well as the characteristic impedance curve depending on the value of the capacitance C connected in series on the resonator.
Figure 4B:
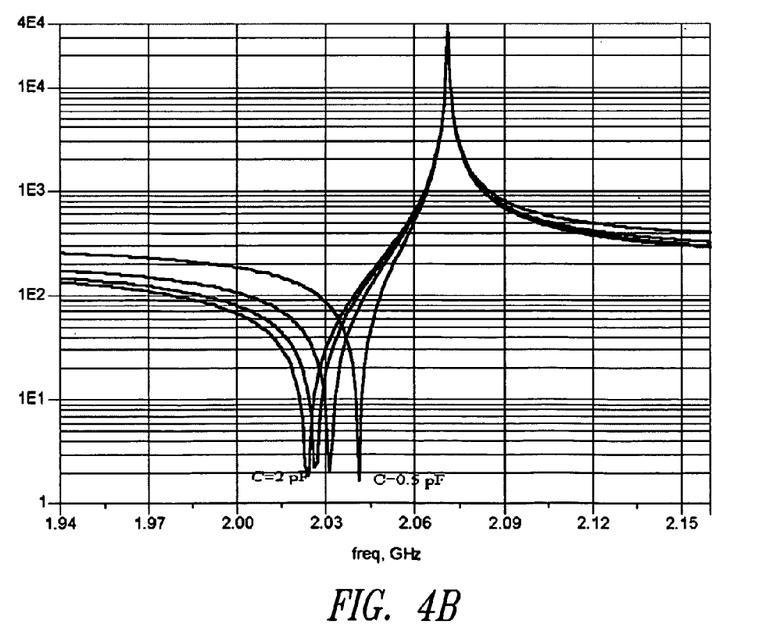
Figure 5:
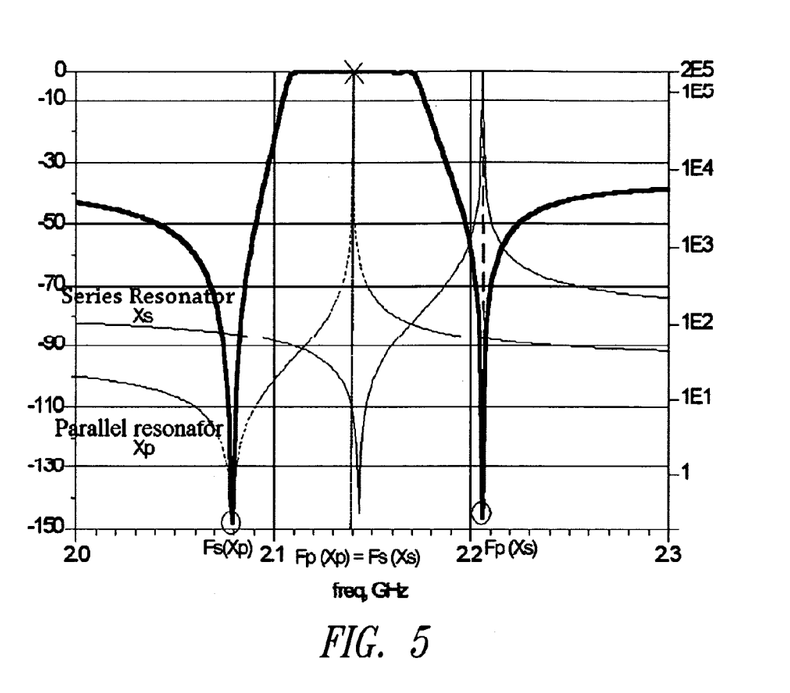
FIG. 5 illustrates the impedance curve of BAW resonators in the serial and parallel branches, and the impedance curve of the cell resulting therefrom.

For the sake of clarity, it is represented in FIGS. 4A and 4B the electrical model equivalent of the parallel branch of cells 310-330, and the characteristic impedance curve depending on the value of the capacitance C connected in series on the resonator.

Generally speaking, the capacitances are passive components that have a quality factor whose value lies in a range of 30 to 50. Furthermore, in the described embodiment, the capacitances are integrated into the parallel branch, bringing little harm to the overall quality factor of the cell filter. This is a significant advantage of the circuit filter described, despite its apparent simplicity.

Looking at, from a theoretical point of view, the effect of the introduction of the capacitance 313 in the parallel branch which includes resonator 312, the impedance can be calculated by the formula below:

$$Z_{in} = \frac{s^2(CC_aL_a + C_0C_aL_a) + C_0 + C_a + C}{sC(s^2C_0C_aL_a + C_0 + C_a)} \quad (I)$$

Attention is drawn to the introduction of one pole and one zero compared to the value of the impedance of a single parallel resonator. The calculations of extrapolation of the pole and the zero lead to the following formulas (II) and (III):

$$s^2(CC_aL_a + C_0C_aL_a) + C_0 + C_a + C = 0 \quad (II)$$

$$s^2 = -\frac{C_0 + C_a + C}{(CC_aL_a + C_0C_aL_a)}$$

$$sC(s^2C_0C_aL_a + C_0 + C_a) = 0 \quad (III)$$

$$s = 0 \text{ and } s^2 = -\frac{C_0 + C_a}{C_0C_aL_a}$$

Equation (III) shows the insertion of a pole at the frequency zero, but one observes that other values are not changed. The equation (II) also shows that the connection of a capacitance in series with a resonator leads to the alteration of zeros in the frequency response. More specifically, by introducing a value of capacitance, one notes that the frequency of resonance series is shifted to the left, while the static value of the capacitance of the resonator tends to decrease.

FIG. 4B illustrates more particularly this effect because of the introduction of a capacitance in series with a resonator located in the parallel branch of a cell. As seen in FIG. 4B, the so-called SERIES resonators (designated by Xs indicating that the resonator is in series) have resonance frequencies slightly higher than the so-called PARALLEL resonators (or Xp). The series resonance (ωs) of resonators PARALLEL, determine the position of the zeros so that a variation of the impedance results in a corresponding change in those zeros.

Referring again to the BVD model, the values of frequencies of resonance series and parallel are given by the following formulas:

$$f_s = \frac{1}{2\pi}\sqrt{\frac{1}{L_aC_a}}$$

$$f_p = \frac{1}{2\pi}\sqrt{\frac{C_a + C_0}{L_a C_a C_0}}$$

Following the introduction of a value of capacitance C, and referring to the previous formula (II), the frequency of the resonance series becomes then:

$$f_s = \frac{1}{2\pi}\sqrt{\frac{C_0 + C_a + C}{(CC_a L_a + C_0 C_a L_a)}}$$

A fine tuning of the filter characteristics can be achieved by changing one or more cells making up the filter in FIG. 3.

Figure 6:
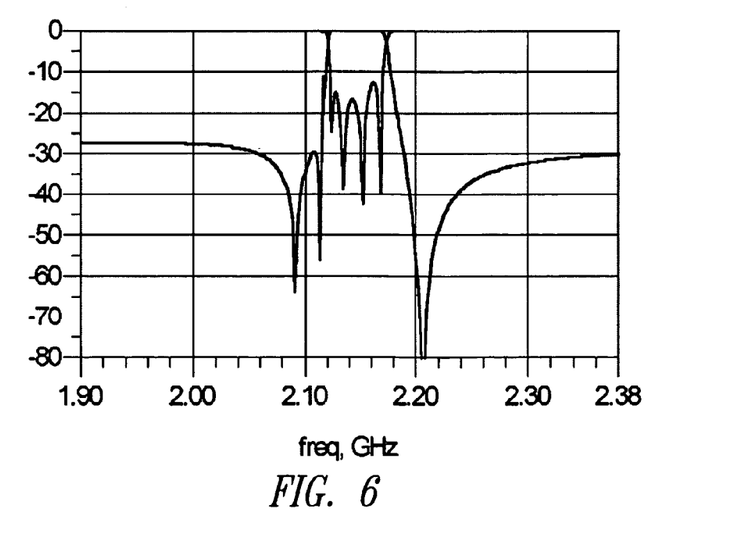
FIG. 6 shows the evolution of the frequency response of the filter with the embodiment of the three capacitances of FIG. 3.

FIG. 6 illustrates the change in the frequency response of the filter which results from the use of all three capacitances 313, 323 and 333.

Figure 7:
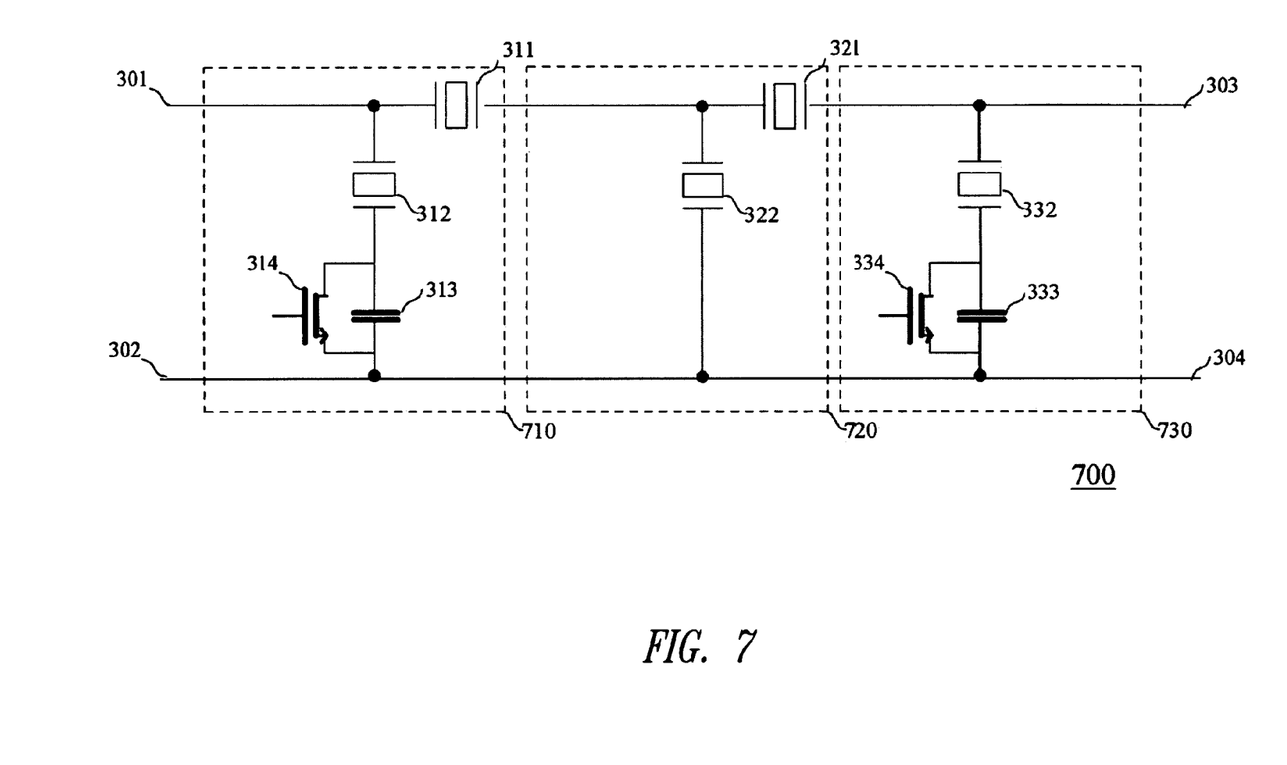
FIG. 7 illustrates a simplified version of the circuit of FIG. 3 achieving a fifth order filter suitable for W-CDMA standard.

FIG. 7 shows a simplified version 700 of the circuit filter of FIG. 3 with only three cells 710, 720 and 730. Cell 710 is identical to cell 310 shown in FIG. 3. Cell 720 has no capacitance in its parallel branch, whereas cell 730 comprises no BAW resonator in its branch series, unlike cell 330 of FIG. 3.

For the sake of clarity, the elements that are identical in FIGS. 3 and 7 still carry the same reference numbers, and one sees that filter 700 differs from the filter illustrated in FIG. 3 in that capacitance 323, transistor 324 and resonator 331 have been removed.

FIG. 7 therefore illustrates a filter of the 5th order, which shows to be less costly to manufacture and which provides fine and fully digital control by means of control voltages applied on the gates of transistors 314 and 334. Such a low cost circuit is suitable for use with a receiver complying with the standard WCDMA (2110-2170 MHz).

Figure 8A:
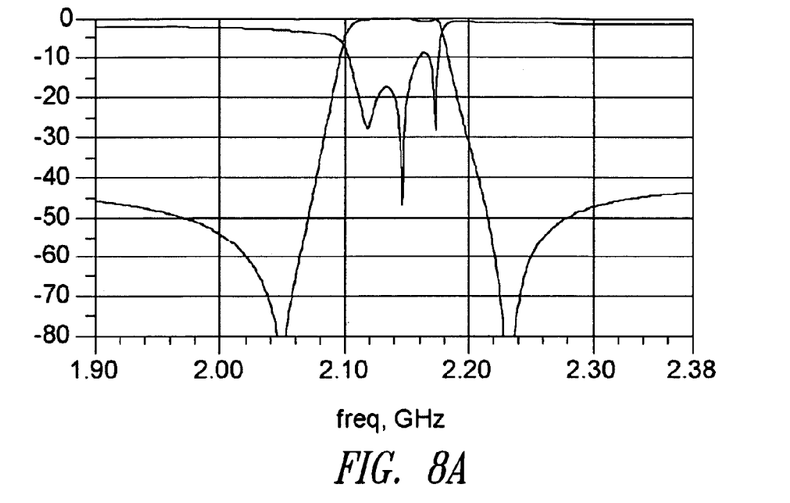
FIGS. 8A, 8B, 8C and 8D illustrate frequency response curves from the filter based on the digital ordering of transistors 314, 324, and 334.

Indeed FIG. 8A shows the frequency response of the filter when transistors 314 and 334 are both switched on, respectively short-circuiting capacitances 313 and 333. In this configuration, filter (2103-2177 MHz) does not fit the W-CDMA standard.

Figure 8B:
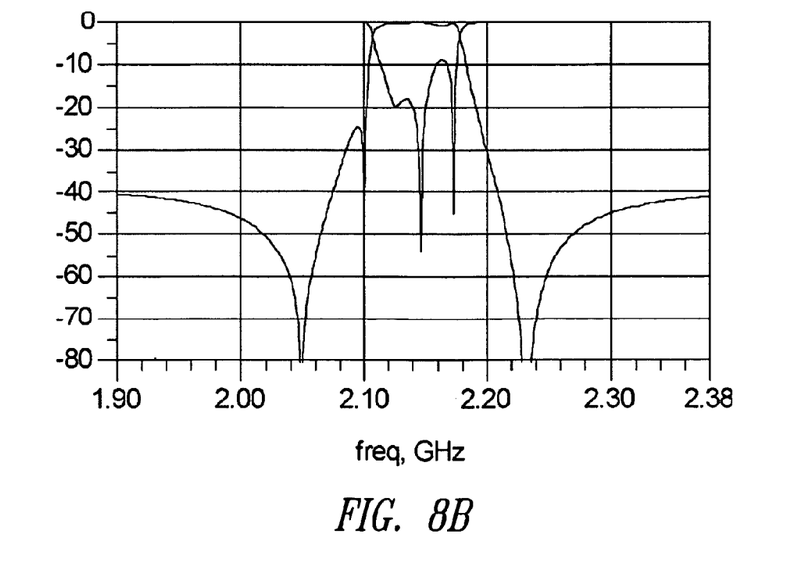
Figure 8C:
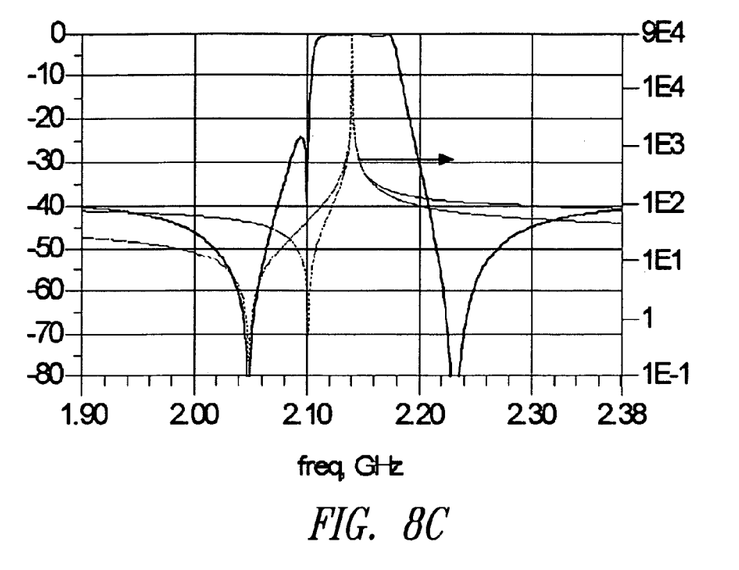

In order to improve the situation and comply with the standard, a blocking of transistor 314 can be used—causing the use of capacitance 313—and thus entailing a reduction of 20% of the bandwidth of the filter (2110-2170 MHz), as illustrated in FIG. 8B. The effect resulting from the insertion of the capacitance 313 on the displacement of zeros is illustrated in FIG. 8C.

Figure 8D:
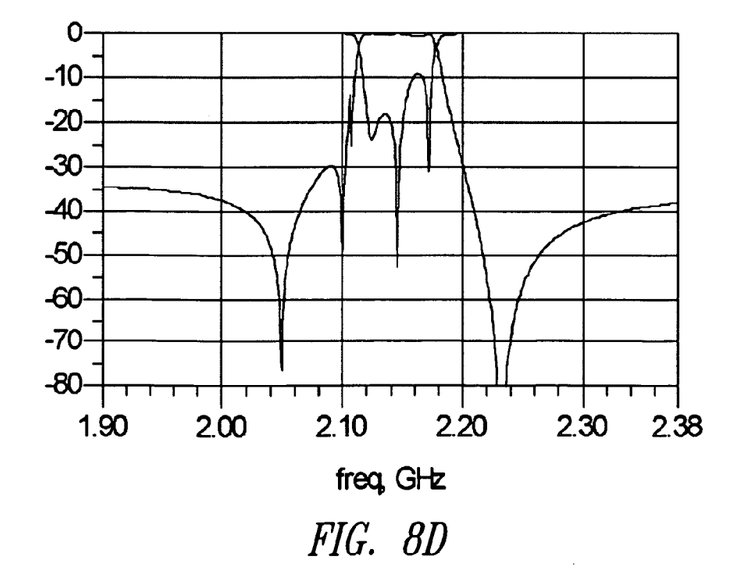

Finally, the blocking of the two transistors 314 and 334 further reduces the bandwidth by the combined effect of both capacitances.

This reduction is reflected in the frequency response curve of FIG. 8D.

The disclosure can be advantageously used in mobile wireless communication, when a receiver is located in one particular area where another mobile telephone is found to generate a signal which might interfere and disrupt the operation of the receiver and one ongoing communication.

In such a situation, it is particularly advantageous to control the transistors in parallel branches to shift the poles and increase the selectivity of the circuit, for example by increasing the latter by 30 dB.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A filtering circuit, comprising:
    first, second, and third cascade connected quadripoles, each quadripole having a series branch that includes a first acoustic resonator and a parallel branch that includes a second acoustic resonator, the first acoustic resonator having a series resonance frequency that is approximately equal to a parallel resonance frequency of the second acoustic resonator, the parallel branch of the first quadripole including a first parallel circuit in series with the second acoustic resonator of the first quadripole, the first parallel circuit including a first capacitance and a first switching transistor coupled in parallel with the first capacitance and structured to short-circuit the first capacitance; and
    a digital control bus coupled to the switching transistor and structured to convey a control voltage to the switching transistor, wherein:
    the second quadripole includes a second parallel circuit in series with the second acoustic resonator of the second quadripole, the second parallel circuit including a second capacitance and a second switching transistor coupled in parallel with the second capacitance and coupled to the digital bus to receive the control voltage and structured to short-circuit the second capacitance; and
    the first and second switching transistors are structured to tune the filtering circuit.

2. The filtering circuit of claim 1 wherein each resonator is a surface mounted resonator and includes a Bragg mirror.

3. A filtering circuit, comprising:
    a first quadripole having two input electrodes, two output electrodes, and two branches, respectively series and parallel,
        wherein the series branch includes a first resonator having series and parallel resonance frequencies,
        wherein the parallel branch includes a second resonator having series and parallel resonance frequencies,
        wherein the parallel resonance frequency of the second resonator is structured to correspond to the series resonance frequency of the first resonator,
        wherein the parallel branch includes a first parallel circuit in series with the second resonator, the first parallel circuit includes a first capacitance and a switching transistor coupled in parallel to the first capacitance and structured to perform a short-circuit of the first capacitance under control of a first control voltage;
    a second quadripole connected in cascade with the first quadripole, and having two input electrodes, two output electrodes, and two branches, respectively series and parallel,
        wherein the series branch includes a third resonator having series and parallel resonance frequencies, wherein the parallel branch includes a fourth resonator having series and parallel resonance frequencies, wherein the parallel resonance frequency of the fourth resonator is structured to correspond to the series resonance frequency of the third resonator;

a third quadripole connected in cascade behind the second quadripole and having two input electrodes, two output electrodes, and two branches, respectively series and parallel, a digital control bus, wherein the series branch of the third quadripole is without any resonator, wherein the parallel branch of the third quadripole has a fifth resonator having series and parallel resonance frequencies, wherein the parallel resonance frequency of the fifth resonator is structured to correspond to the series resonance frequency of the third resonator, and wherein the parallel branch of the third quadripole includes a second parallel circuit in series with the fifth resonator, the second parallel circuit includes a second capacitance and a second switching transistor coupled in parallel with the second capacitance and structured to short-circuit the second capacitance under control of a second control voltage, the first and second switching transistors being coupled to the digital control bus and structured to receive respectively the first and second control voltages from the digital control bus.

4. The filtering circuit according to claim 3, wherein the resonators are surface mounted BAW resonators.

5. A process comprising:
detecting a disturbance signal near a mobile band used by a receiver of a mobile telephone for an ongoing communication, the receiving including a filtering circuit based on a cascade of cells, each cell having a series branch having a first BAW resonator and a parallel branch having a second BAW resonator, each parallel branch including a parallel circuit coupled in series with the second BAW resonator, each parallel circuit including a capacitance and a switching transistor coupled in parallel with the capacitance;
in response to the detecting, controlling one of the switching transistors directly through a digital control bus in order to modify an effect of the capacitance coupled to the one of the switching transistors in a frequency response of the filter.

6. The process of claim 5 wherein the resonators comprise surface mounted resonators.

7. The process of claim 5, comprising using the process in a 4th generation mobile telephone.

8. A circuit, comprising:
a plurality of series-coupled quadripole cells, each cell including:
first and second inputs and first and second outputs, the first and second outputs coupled to first and second inputs of an adjacent one of the quadripole cells, with the first and second outputs of a last cell in the plurality of series-coupled quadripole cells forming an output of the circuit;
a series branch having a first acoustic resonator coupled between the first input and the first output;
a digital control bus configured to provide a control signal;
a parallel branch coupled between the first input and the second output and having coupled in series a second acoustic resonator and parallel circuit that includes a capacitance and a switching transistor coupled in parallel with the capacitance and coupled to the digital control bus, wherein the first acoustic resonator has a series resonance frequency that is approximately equal to a parallel resonance frequency of the second acoustic resonator;
the switching transistor is configured to receive the control voltage and short-circuit the second capacitance; and
the switching transistors of the cells are structured to tune the circuit.

9. The circuit of claim 8 wherein the first and second acoustic resonators include BAW acoustic resonators.

10. The circuit of claim 8 wherein the switching transistor is structured to short-circuit the capacitance when the switching transistor is turned on.

11. The circuit of claim 8 wherein each switching transistor of each quadripole cell is structured to tune the circuit.

12. The circuit of claim 8 wherein each acoustic resonator includes a Surface Mounted Resonator that includes a Bragg mirror.

13. A circuit, comprising:
a plurality of resonator cells coupled in series and including:
a first resonator cell having two inputs and two outputs, a first acoustic resonator coupled in series between the first input and the first output, a second acoustic resonator and first capacitance coupled between the first input and the second output, and a first switching transistor coupled in parallel with the first capacitance to short-circuit the first capacitance;
a second resonator cell having first and second inputs coupled respectively to the first and second outputs of the first resonator cell, first and second outputs, a third acoustic resonator coupled in series between the first input and the first output of the second resonator cell, and a fourth acoustic resonator coupled between the first input and the second input of the second resonator cell; and
a third resonator cell having first and second inputs coupled to the first and second outputs of the second resonator cell, a fifth acoustic resonator and second capacitance coupled between the first and second inputs of the third resonator cell, and a second switching transistor coupled in parallel with the second capacitance to short-circuit the second capacitance, wherein the switching transistors are coupled to a digital control bus and are structured to tune the circuit.

14. The circuit of claim 13 wherein each of the acoustic resonators comprises a BAW resonator.

15. The circuit of claim 14 wherein each of the BAW resonators comprises a surface mounted resonator arranged on a Bragg mirror.

16. The circuit of claim 13 wherein the series coupled resonator cells comprise a bulk acoustic wave resonator filter of the fifth order.

17. The circuit of claim 13 wherein a series resonance frequency of each of the second acoustic resonator comprises:

$$f_s = \frac{1}{2\pi}\sqrt{\frac{C_0 + C_a + C}{(CC_aL_a + C_0C_aL_a)}}$$

wherein C represents a value of the first capacitance, $C_a$ represents an equivalent circuit series capacitance at the series resonance frequency, $C_0$ corresponds to a physical capacitance between electrodes of the second acoustic resonator, and $L_a$ represents the equivalent circuit series inductance at the series resonance frequency.

* * * * *